United States Patent [19]
Dettro et al.

[11] Patent Number: 5,638,375
[45] Date of Patent: Jun. 10, 1997

[54] AGC ISOLATION OF INFORMATION IN TDMA SYSTEMS

[75] Inventors: Gregory J. Dettro, Arlington Heights; Gerald P. Labedz, Chicago; Frederick G. Atkinson, Winfield, all of Ill.

[73] Assignee: Motorola, Inc., Schaumburg, Ill.

[21] Appl. No.: 277,724

[22] Filed: Nov. 30, 1988

[51] Int. Cl.$^6$ ............................................. H04J 3/06
[52] U.S. Cl. ............................ 370/324; 370/516; 375/317; 375/342
[58] Field of Search ................................. 370/104, 100, 370/85, 104.1, 95.3, 93, 10, 95.1, 94.1, 324, 516; 375/76, 98, 342, 317, 224; 455/234, 232.1, 233.1, 234.1, 234.2

[56] References Cited

U.S. PATENT DOCUMENTS

| | | | |
|---|---|---|---|
| 3,257,651 | 6/1966 | Feisel | 370/10 |
| 3,746,993 | 7/1973 | Ahmed et al. | 375/81 |
| 4,482,999 | 11/1984 | Janson et al. | 370/94.1 |
| 4,500,987 | 2/1985 | Hasegawa | 370/94.1 |
| 4,554,508 | 11/1985 | Hague | 455/234.1 |
| 4,625,240 | 11/1986 | Yablonski et al. | 375/98 |
| 4,630,267 | 12/1986 | Costes et al. | 370/104 |
| 4,672,630 | 6/1987 | Kaku | 375/224 |
| 4,691,377 | 9/1987 | Yoshihara et al. | 375/98 |
| 4,697,263 | 9/1987 | Beaufoy | 370/104 |
| 4,712,212 | 12/1987 | Takai et al. | 370/104 |
| 4,722,093 | 1/1988 | Tejima | 370/95.3 |
| 4,742,512 | 5/1988 | Akashi et al. | 370/104.1 |
| 4,745,599 | 5/1988 | Raychandhuri | 370/93 |
| 4,757,502 | 7/1988 | Meuriche et al. | 370/104 |
| 4,800,560 | 1/1989 | Aoki et al. | 370/104 |
| 4,852,090 | 7/1989 | Borth | 455/65 |
| 4,977,580 | 12/1990 | McNichol | 370/95.3 |
| 4,979,170 | 12/1990 | Gilhousen et al. | 370/104.1 |

*Primary Examiner*—Douglas W. Olms
*Assistant Examiner*—Min Jung
*Attorney, Agent, or Firm*—Richard A. Sonnentag

[57] ABSTRACT

In a communications system having transmissions containing certain information-of-interest at predetermined intervals in the transmission, there is provided a method for isolating and processing that information-of-interest. The method comprises sensing the start of a transmission and isolating for processing as the information-of-interest, the information received about instant(s) predeterminally removed in time from the sensed start of transmission. Thus, the information-of-interest is isolated principally on the basis of elapsed time.

The method for isolating and processing that information-of-interest is further characterized by sensing the start of a transmission from the received signal power of the transmission exceeding a predetermined threshold; AGCing the transmission and attenuating the AGC'd transmission from a maximum level to a desired level before the information-of-interest is expected to arrive; isolating for processing as the information-of-interest, the information received about instant(s) predeterminally removed in time from the sensed start of transmission, by timing the expected interval between the instant that the start of the transmission is sensed and the predetermined instant that the information-in-interest should arrive (whereby the information-of-interest is isolated principally on the basis of elapsed time); tagging the information isolated about that instant for processing; and beginning processing with information just preceeding the isolated information (whereby the reliability of the information detection is enhanced by one-to-several bits).

16 Claims, 3 Drawing Sheets

AGC ISOLATION OF INFORMATION IN TDMA SYSTEMS

THE FIELD OF INVENTION

This invention is concerned with AGC isolation of information in TDMA systems. More particularly, this invention is concerned with methods for isolating and processing information-of-interest at predetermined intervals in burst transmission used for access to TDMA communications systems.

BACKGROUND OF THE INVENTION

In wideband land-mobile, radio communication systems utilizing Time Division multiplexed Multiple Access (TDMA) control, such as the cellular system proposed for use in Europe, an RF channel is shared (time-division-multiplexed) among numerous subscribers attempting to access the radio system in certain ones of various time-division-multiplexed time slots.

FIG. 1 is a specification of the TDMA RF protocol of the GSM Pan-European Digital Cellular System, including the access burst specification.

As illustrated in FIG. 1, eight time slots are arranged into periodically repeating frames. Subscriber stations are given information about the transit time of their transmissions to permit them to advance or retard their transmissions to synchronize with the base station such that nearly the entire time slot is filled with digital information of 148 bits. However, subscribers attempting to initially access the system have no information about the propagation delay of their transmissions. Thus, time slot 0 in certain frames is reserved for those attempting to initially access the system. Their burst transmissions used to initially access the system are foreshortened to allow for transmissions ranging from a huge signal transmitted from right next to the base station antenna to a moderate signal transmitted from moderate distance to a weak signal transmitted from the boundary of the cell and to allow for their concomitant propagation delays. The base station receiver must be prepared to receive a signal virtually anytime during the 9/10ths of a milliseconds time slot, must get the gain of a signal that is unpredictable by as much as 100 dB (depending upon distance) within the dynamic range of the receiver (say 48 dB) during the 30 microseconds (8 bits at 270 kilobits/second) of transmitter key up and in time to detect the signal envelope during the 30 microseconds (8 bits) of head information and correlate 152 microseconds (41 bits) of synchronizing information before the 133 microseconds (36 bits) of useful information disappears. This situation provides a formidable challenge indeed.

Ordinarily, the base station would miss the access burst of the subscriber because the gain would either be too low and the detection and correlation would false on noise or the gain would be too high and the signal would saturate the receiver. The subscriber, failing to receive acknowledgement and propagation delay information for subsequent accesses would gradually reduce its power on subsequent retries and then increase its power again until finally the base station and subscriber happened upon the right combination.

This invention takes as its object to overcome these challenges and to realize certain advantages presented below.

SUMMARY OF THE INVENTION

This invention capitalizes on the recognition that, in TDMA systems, transmitted information can be processed off-line and in non-real time during the intervening time slots if fast AGC is employed to sense the start of a burst transmission and if the information-of-interest is isolated for subsequent processing principally on the basis of elapsed time.

Thus, in a communications system having transmissions containing certain information-of-interest at predetermined intervals in the transmission, there is provided a method for isolating and processing that information-of-interest. The method comprises sensing the start of a transmission and isolating for processing as the information-of-interest, the information received about instant(s) predeterminally removed in time from the sensed start of transmission. Thus, the information-of-interest is isolated principally on the basis of elapsed time.

The method for isolating and processing that information-of-interest is further characterized by sensing the start of a transmission from the received signal power of the transmission exceeding a predetermined threshold; AGCing the transmission and attenuating the AGC'd transmission from a maximum level to a desired level before the information-of-interest is expected to arrive; isolating for processing as the information-of-interest, the information received about instant(s) predeterminally removed in time from the sensed start of transmission, by timing the expected interval between the instant that the start of the transmission is sensed and the predetermined instant that the information-in-interest should arrive (whereby the information-of-interest is isolated principally on the basis of elapsed time); tagging the information isolated about that instant for processing; and beginning processing with information just preceeding the isolated information (whereby the reliability of the information detection is enhanced by one-to-several bits).

DESCRIPTION OF THE DRAWINGS

Additional objects, features, and advantages of the invention will be more clearly understood and the best mode contemplated for practicing it in its preferred embodiment will be appreciated (by way of unrestricted example) from the following detailed description, taken together with the accompanying drawings in which.

DETAILED DESCRIPTION

Figure 1:
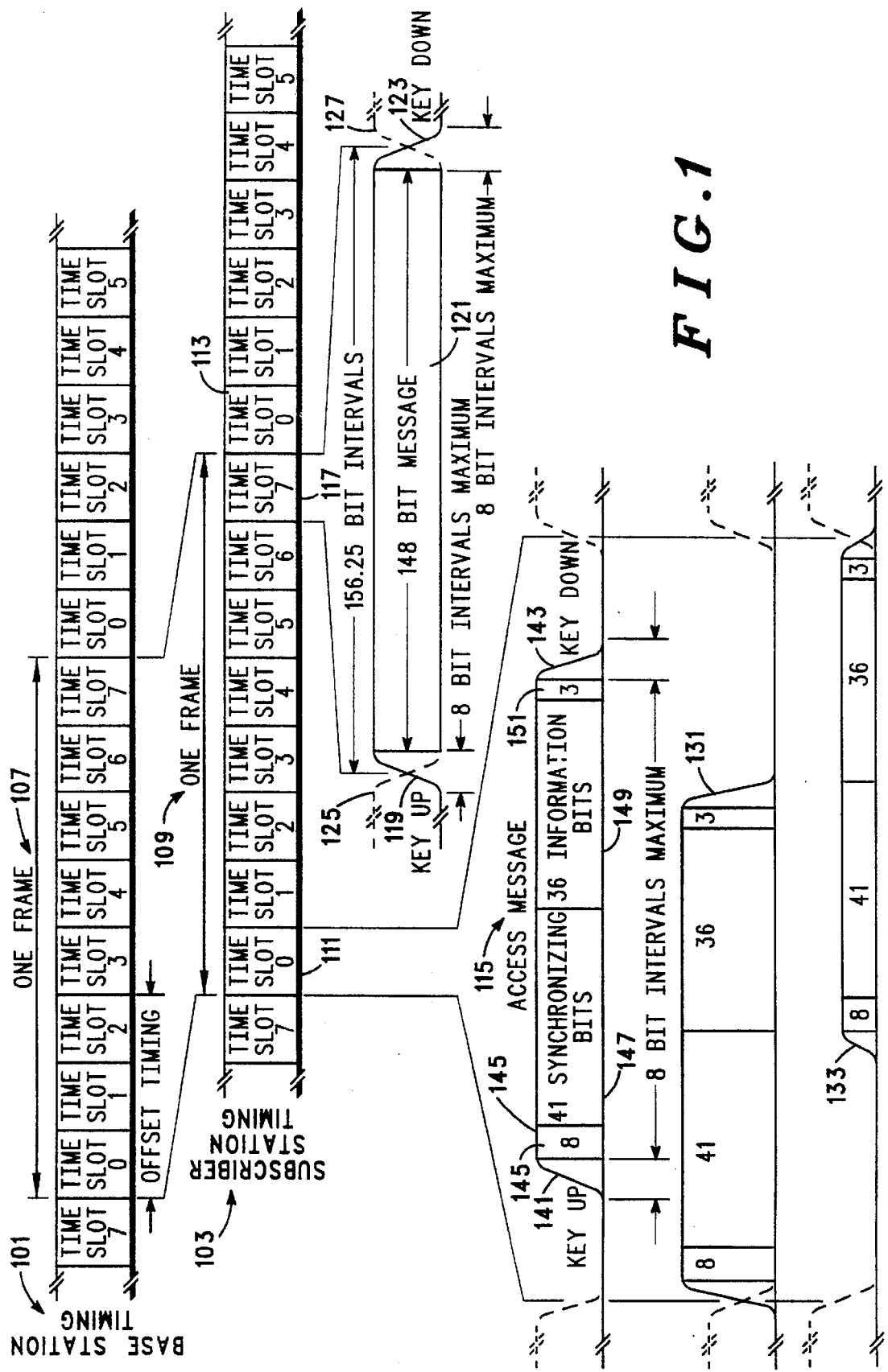
FIG. 1 is a specification of the TDMA RF protocol of the GSM Pan-European Digital Cellular System, including the access burst specification.

FIG. 1 is a specification of the TDMA RF protocol of the GSM Pan-European Digital Cellular System, including the access burst specification.

The receiver of the preferred embodiment operates as part of a full duplex channel controlling base station in a TDMA communications system in which each of a multiple of full duplex channel controlling base stations (Bases) each transmits on one radio frequency of a pair, and a multiple of subscriber stations (Subscriber units), as required, transmit on the other. All information is transmitted using Gaussian Minimum Shift Keying (GMSK), at about 270.833 kilobits/second, and all Subscriber units communicating with a given Base coordinate their timing with the Base. FIG. 1 depicts the transmitter timing for both a Base and its Subscriber units. Each Base transmits only during occupied time-slots, at 101 and Subscriber units in communications with that Base transmit each in its assigned time-slot 103, with a specified subscriber offset timing 105. There are 8 full duplex time-slots, each being 156.25 bit intervals, or about 0.577 ms, in duration, as depicted in FIG. 1, so each frame 107 & 109 is about 4.616 ms in duration. The seven Time-Slots 1 through 7 carry traffic and are called Traffic Slots; during the eighth, Time-Slot 0 at 111 & 113, called the Access Slot, access attempts by the Subscriber units are permitted. Access attempts are used by the Subscriber units primarily for responding to pages and for originating requests for service. For an access attempt, a Subscriber sends an Access Message 115 and then waits for a reply from the Base, timing out to a random retry. In normal course, the Base will respond to an Access Message by sending, during its Time-Slot 0, a message which assigns the Subscriber a Slot and specifies a propagation delay timing correction and power level.

During each Traffic Slot (Time-Slot 7, for example at 117 in FIG. 1) the Subscriber assigned to that slot keys up the RF power at 119 to a specified level, transmits a 148 bit message at 121, and keys down the RF power at 123, being allowed 8 bit intervals each for key up and key down, these sequences generally overlapping key down of the preceding time-slot 125 and key up of the following time-slot 127, respectively. To achieve this precise timing, they must not only synchronize their transmitter timing with the Base, they must further adjust their timing as specified by the Base.

Access Messages, at 115 of FIG. 1, are shorter than traffic messages, having only 88 total bits between key up and key down. The Subscriber units served by a Base may be anywhere within 35 km, this range limit being a function of antenna height, transmitter power, availability of other, closer Bases, and system constraints that permit a Base to ignore Access Messages from more distant Subscriber units. System protocol requires that Subscriber units transmit their Access Messages at the nominal subscriber offset timing 105, relative to the Base's transmitter timing. Because of the variations in propagation delay, the time of arrival of these Access Messages at the Base may vary from early in the Access Slot, usually with a larger magnitude, as depicted at 131, or late in the slot and of lesser magnitude, as depicted at 133, but not so as to mutilate the data being received in the adjacent time-slots. Access Messages follow the format of 115 in FIG. 1. Key up 141 and key down 143 are controlled as for traffic messages. The head bits 145 serve the useful purpose of providing a known state during key up, for AGC settling, and, in signal processing, a confirmation against false synchronization. Sync bits 147 are used for both clock recovery and to determine the propagation delay to which the Access Message was subject. Information bits 149 temporarily identify the user. In addition, head bits 145 and tail bits 151, being of known value to the receiving Base, are of use in refining multiple-ray equalizer tap settings.

Figure 2:
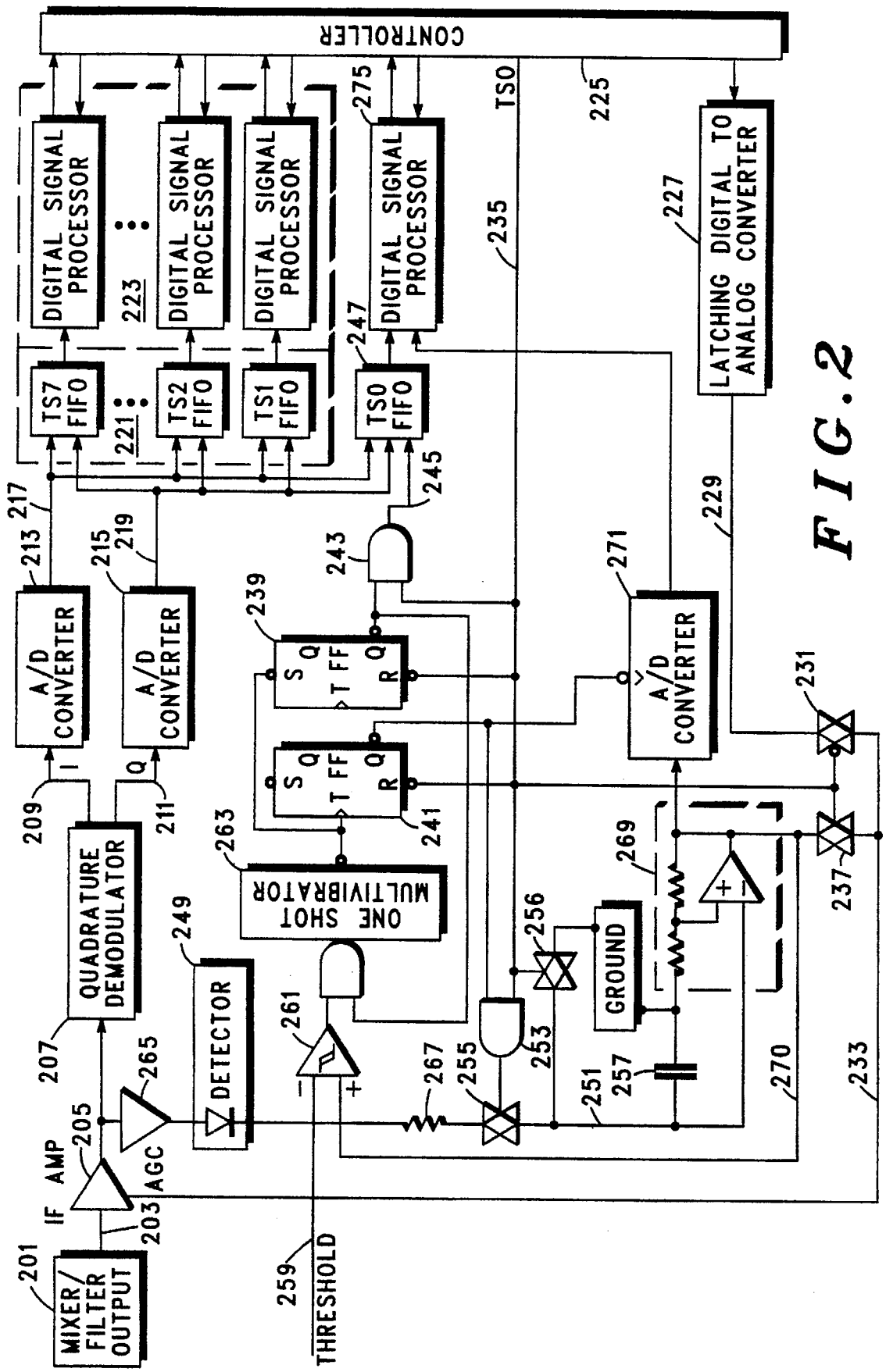
FIG. 2 is a functional block diagram of the preferred embodiment of the invention.

FIG. 2 is a functional block diagram of the preferred embodiment of the invention.

For each Traffic Slot, wherein the received signal has a recent AGC history, the AGC sub-system of the preferred embodiment routes a previously calculated, digitally filtered AGC setting to a digital to analog converter, the output of which is routed to the AGC control input of the receiver's IF amplifier, establishing its gain for the time-slot. The IF amplifier output feeds a conventional quadrature demodulator, the I and Q outputs of which are digitized and stored, after which, in turn, the average power is calculated, an AGC error is calculated, a raw AGC setting is calculated, and then filtered by a recursive Instantaneous Impulse Response (IIR) low pass filter to obtain the filtered AGC setting to be used during reception of the same Traffic Slot in the following frame and for received signal strength calculations.

For Access Slots, in order to better receive Access Messages, the output of the digital to analog converter is not used for gain control. Instead, the AGC sub-system applies carrier controlled AGC until a predetermined time after a signal strength above a predetermined threshold is detected, after which the AGC value determined during this interval is held for the remainder of the time-slot, and digitized for use in establishing a preliminary Traffic Slot AGC setting. Furthermore, the digital I and Q readings taken prior to the threshold detection are tagged as such. A useful value for the predetermined time is approximately the time it takes to receive the head bits 145 of FIG. 1; thus, Access Messages except for the head bits are each received with a constant gain setting, such that the IF amplifier output level is within the dynamic range of the I and Q digital to analog converters.

FIG. 2 illustrates a block diagram of the received signal processing and AGC sub-system employed in the preferred embodiment of the present invention. In a GMSK receiver, conventional RF stage, mixer and filtering 201 feed a 10.7 MHz IF signal 203 to a conventional IF amplifier 205 with gain control provisions, such as an MC1350 manufactured by Motorola. The IF amplifier's output feeds a buffer 265 and a conventional quadrature demodulator 207 comprising a 10.7 MHz local oscillator, a 90° phase shifter, a pair of mixers and a pair of low pass filters. Baseband I and Q signal outputs 209 & 211 from the quadrature demodulator are therefore separated in phase by 90°. These two signals, I and Q, are fed to a pair of flash Analog to Digital converters (Flash A/Ds) 213 & 215, such as CA3318CE manufactured by RCA, arranged to provide a plurality of pairs of 8-bit samples per bit interval during reception. Outputs 217 & 219 from the Flash A/D feed a multiple of conventional First In, First Out (FIFO) buffer memories 221 & 247, each followed by a Digital Signal Processor (DSP) 223 & 275, such as DSP56001 manufactured by Motorola. Each FIFO-DSP combination 221 & 223 stores and processes the information for one Traffic Slot, which processing includes the IIR filtering of a new AGC setting for each frame. Each feed its AGC setting, once each frame, to a controller 225, a conventional microcomputer which also controls transmitter message flow, and which, at the beginning of each Traffic Slot, feeds the previously calculated AGC setting for the respective slot to a latching Digital to Analog converter (D/A) 227, such as 7528LN manufactured by Analog Devices. AGC voltage 229 from the D/A is routed through a conventional first transmission gate 231 and applied to the AGC input 233 on the IF amplifier. During the Traffic Slots, a signal TS0 at 235 from the controller 225 is low, ensuring that the first transmission gate is conductive and that a second transmission gate 237 is open circuit. During the Traffic Slots, TS0 235 holds the Access Slot circuitry inactive by:

resetting a set-reset flip-flop 239 and a toggle flip-flop 241, and acting through a first AND gate 243 to hold tag bits 245 inactive low into a TS0 FIFE) 247, and disconnecting the signal detect circuitry, comprising a buffer 265 from the IF amplifier output, a detector 249 and a resistor 267 in series, from the input 251 to the access AGC circuitry, comprising a capacitor 257 and a conventional high impedance amplifier 269, by acting through a second AND gate 253 to place a third transmission gate 255 open circuit, and grounding the unamplified AGC voltage 251 by placing a fourth transmission gate 256 in the conductive state, thus discharging the capacitor and preventing Access AGC voltage 270, amplified by the high impedance amplifier, from exceeding threshold 259 at a conventional comparitor 261, thereby preventing a conventional one-shot multivibrator 263 from being triggered.

During each Access Slot, TS0 is active high. At the beginning of the slot, two changes take place within the AGC sub-system. First, all four transmission gates change state, so that the unamplified AGC is ungrounded at the fourth transmission gate 256 and detector output is applied to it by the third transmission gate 255, and the D/A 227 is disconnected from the AGC voltage by the first transmission gate 231 and Access AGC voltage 270, initially low, is applied to it by the second transmission gate 237. Thus, the AGC loop at the beginning of each Access Slot starts at the IF amplifier output, is buffered and detected, the detected signal feeding through the resistor and the third transmission gate 255 to the capacitor 257, and after suitable amplification, is fed through the second transmission gate 237 to apply the AGC voltage 233 to the IF amplifier.

Secondly, the first AND gate 243 feeds the tag bits 245 active high to a TS0 FIFO 247, which stores this state with each pair of Flash A/D samples 217 & 219, which samples are taken continuously during the Access Slot in the same manner as during Traffic Slots. The initially low value of the Access AGC voltage ensures that at least one pair of samples tagged active high will be stored in the TS0 FIFO, even when a large carrier is initially present.

This state continues for the entire Access Slot unless a signal of sufficient magnitude is received so that the Access AGC voltage 270 exceeds the threshold 259 at the comparitor 261, causing the comparitor output to go high, triggering the one-shot multivibrator 263, the output of which goes active low for a predetermined interval of 8 bit times. Its leading edge sets the set-reset flip-flop 239, the output of which goes low and stays low for the duration of the Access Slot, and serves to change the tag bits inactive low at the first AND gate 243 and to inhibit further triggering of the one-shot multivibrator 263. At the end of the predetermined interval of 8 bit times, the trailing edge of the multivibrator 263 output, going high, triggers the toggle flip-flop 241 to, the set state; its active low output performs two functions. First, it triggers a Slow Analog to Digital converter (Slow A/D) 271, such as MC6108 manufactured by Motorola, which digitizes the Access AGC voltage, and, secondly, through the second AND gate 253, turns off the third transmission gate 255, allowing the capacitor 257 to retain the value of the unamplified AGC voltage 251 prevailing at that instant for the duration of the Access Slot.

Figure 3:
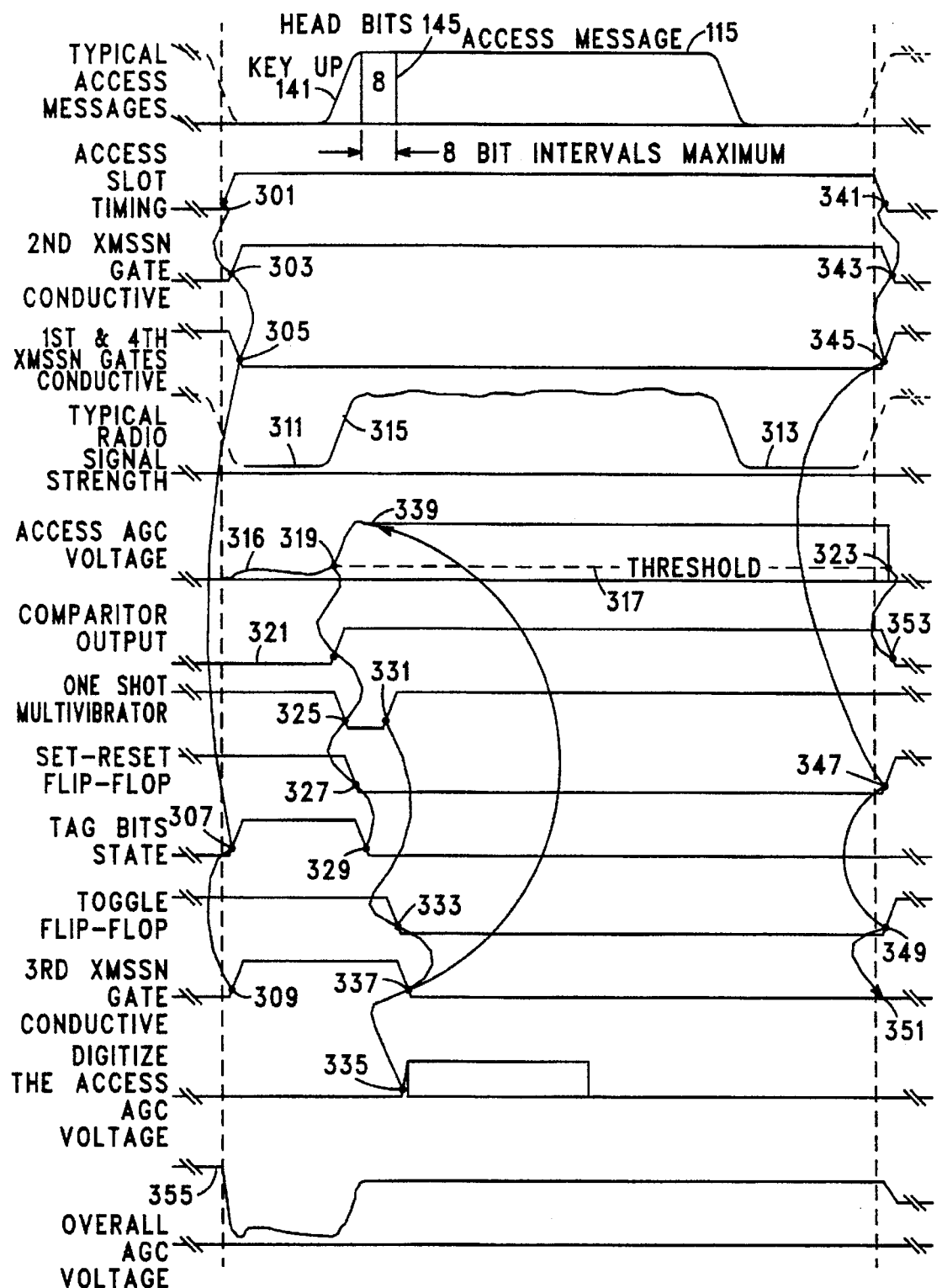
FIG. 3 is a timing diagram of the operation of the preferred embodiment of FIG. 2.

FIG. 3 is a timing diagram of the operation of the preferred embodiment of FIG. 2.

FIG.-3 illustrates the timing of the above process during reception of a typical Access Message, 115 of FIG.-1, with its key up time 141 and head bits 145, received during an Access Slot 301. The leading edge of the Access Slot places the second transmission gate conductive at 303, the first and fourth transmission gates open circuit at 305, the tag bits active high at 307 and the third transmission gate conductive at 309. The typical radio signal strength is seen to be noise until the message starts at 311, and again after the message at 313, but during the message the signal 315 more or less tracks the message profile, subject to propagation variances.

Access AGC voltage 316 starts out low, responds to the noise, and then, with some delay, tracks the leading edge of the signal until the third transmission gate switches to an open circuit state at 339, permitting the capacitor to hold its charge. When the Access AGC voltage exceeds the threshold 319, comparitor output 321 goes active high. This triggers the one-shot multivibrator at 325, the leading edge of which sets the set-reset flip-flop 327, which in turn changes tag bits low at 329. The multivibrator, timing out at 331, triggers the toggle flip-flop at 333, which in turn triggers the Slow A/D at 335 which digitizes the Access AGC voltage, and also places the third transmission gate open circuit at 337, which in turn allows the capacitor to retain its charge at 339. When the Access Slot terminates at 341, it open circuits the second transmission gate at 343, places the first and fourth transmission gates in conductive state at 345 to enable the Traffic Slot AGC and discharge the capacitor, respectively, and resets the two flip-flops at 347 and 349; had no signal arrived which exceeded threshold, then the Access Slot termination would also have open circuited the third transmission gate at 351. When the capacitor is discharged below threshold at 323, the comparitor responds at 353. Returning now to FIG. 2, one objective of this AGC so described is to restrict the amplitude of the I and Q signals 209 & 211 to within the resolving power of the Flash A/Ds 213 & 215; another is to simplify the processing of the received data, wherein the state of the tag bit associated with each pair of Flash A/D samples is usefully applied. At the end of the Access Slot, an Access Slot DSP 275 examines the TS0 FIFO contents, to determine if an Access Message were received, and if so, precisely when it started, as well as its contents. The time determination is a two step process. The approximate start of a message is determined by the tag bit transition from high to low; the Access Slot DSP then searches the data following this mark for a correlation with the known 41 synchronizing bits 147 of FIG.-1, using the correlation peak for more precise start of message determination. This procedure avoids false correlation which might otherwise occur in the tagged field and also reduces the Access Slot DSP's workload (and perhaps the number of required DSPs) by narrowing the correlation interval. Having obtained a satisfactory correlation, the Access Slot DSP processes the information bits, calculates the power of IF amplifier output, averaged over the remainder of the Access Message after the head bits, and calculates the AGC error. It then samples the state of the Slow A/D 271, normalizes it to the D/A 227, and subtracts the AGC error to arrive at a Corrected AGC Setting that would yield the desired power from the IF amplifier if the signal strength of the accessing Subscriber were unchanging. This Corrected AGC Setting is then forwarded to the controller 225, along with the received Access Message and its time of arrival.

In normal course of events, the controller, upon receipt of this information, allocates a Traffic Slot to the Subscriber which sent the Access Message. It then transmits a time-slot assignment and time correction factor message to that Subscriber, coordinating, as it does so, two other vital communications. First, it loads the Corrected AGC Setting into D/A 227 at the beginning of the Traffic Slot in the first frame in which the Subscriber is scheduled to transmit, and second, it sends the Corrected AGC Setting to the respective Traffic Slot's DSP, which then primes its IIR filter with the Corrected AGC Setting as the value for all recent filtered AGC settings, with zero error for each, as the recent AGC history, this having the beneficial effect of minimizing the transient conditions of gain control, and reducing the signaling error rate during the first several frames received in the Traffic Slot.

Subsequent to the reception of this slot in each frame thereafter, as long as this Subscriber occupies the slot, the Traffic Slot's DSP will provide the controller with an updated timing correction for the Subscriber and an updated filtered AGC setting to be used during reception of the same slot in the following frame. This AGC setting further allows the controller to command an adjustment in the subscriber's transmit power, if desired.

In summary then, in a communications system having transmissions containing certain information-of-interest at predetermined intervals in the transmission, there has been provided a method for isolating and processing that information-of-interest. The method comprises sensing the start of a transmission and isolating for processing as the information-of-interest, the information received about instant(s) predeterminally removed in time from the sensed start of transmission. Thus, the information-of-interest is isolated principally on the basis of elapsed time.

The method for isolating and processing that information-of-interest has further been characterized by sensing the start of a transmission from the received signal power of the transmission exceeding a predetermined threshold; AGCing the transmission and attenuating the AGC'd transmission from a maximum level to a desired level before the information-of-interest is expected to arrive; isolating for processing as the information-of-interest, the information received about instant(s) predeterminally removed in time from the sensed start of transmission, by timing the expected interval between the instant that the start of the transmission is sensed and the predetermined instant that the information-in-interest should arrive (whereby the information-of-interest is isolated principally on the basis of elapsed time); tagging the information isolated about that instant for processing; and beginning processing with information just preceeding the isolated information (whereby the reliability of the information detection is enhanced by one-to-several bits).

While the preferred embodiment of the invention has been described and shown, it will be appreciated by those skilled in the art that other variations and modifications of this invention may be implemented. For example, either the information-of-interest or other than the information-of-interest may be tagged, as desired; information can be tagged either at the A/Ds or at the FIFO or any other convenient point; the prevailing AGC level and the AGC power detected by an AGC power detector may be utilized for other system determinations, especially cellular handoff determinations. Also, where the information-of-interest was to be processed in real time, rather than first stored and processed later, the process of first setting an AGC, then indicating to the real time processor the beginning of the information-of-interest would still be helpful; the AGC is still capable of reducing the required dynamic range, as represented by the number of flash ND bits. Instead of tagging stored bits as representing the information-of-interest, a real time signal would be sent to the processor a predetermined time after the signal envelope had crossed a predetermined threshold, thereby reducing processing time and reducing false synchronization on noise.

These and all other variations and adaptations are expected to fall within the ambit of the appended claims.

What we claim and desire to secure by Letters Patents is:

1. In a communications system having a transmission containing an information-of-interest at a predetermined location within the transmission, a method for isolating and processing that information-of-interest, comprising:

sensing a beginning of the transmission;

isolating for processing as the information-of-interest, a portion of the transmission received beginning at a time temporally removed from the sensed beginning of the transmission;

processing the information-of-interest isolated beginning at the time temporally removed from the sensed beginning of the transmission by decoding, detecting, and correlating the information-of-interest, non-real-time, in a Digital Signal Processor.

2. A method as claimed in claim 1, wherein sensing the beginning of the transmission comprises:

sensing when a received signal power of the transmission exceeds a predetermined threshold.

3. A method as claimed in claim 1 above, further comprising:

Automatically Gain Controlling the transmission and attenuating the AGC'd transmission from a maximum level to a desired level before the information-of-interest is expected to arrive.

4. A method as claimed in claim 3, wherein the information-of-interest is expected to begin in 8 bit time periods from the sensed beginning of the transmission.

5. A method as claimed in claim 4, wherein the information-of-interest is expected to begin in about 26 microseconds from the sensed beginning of the transmission.

6. A method as claimed in claim 3, further comprising:

holding the AGC voltage at a level prevailing at the time temporally removed.

7. A method as claimed in claim 6, wherein the AGC voltage is held using a diode detector in an I.F. stage of a receiver.

8. A method as claimed in claim 3 above, wherein information about an AGC level of the transmission is retained for reception of a subsequent transmission.

9. A method as claimed in claim 1, wherein the step of isolating comprises the step of:

timing the expected interval between a time the beginning of the transmission is sensed and the time temporally removed in which the information-of-interest should begin.

10. A method as claimed in claim 9 above, wherein a one-shot multivibrator with a time constant representative of the time temporally removed from the sensed beginning of the transmission is utilized for timing.

11. A method as claimed in claim 1, wherein processing the information-of-interest comprises:

beginning the processing with information just preceding the information-of-interest.

12. In a communications system having a transmission containing an information-of-interest at a predetermined location within the transmission, a method for isolating and processing that information-of-interest, comprising:

sensing the start of the transmission from a received signal power of the transmission exceeding a predetermined threshold;

AGCing the transmission and attenuating the AGC'd transmission from a maximum level to a desired level before the information-of-interest is expected to arrive;

isolating, for processing as the information-of-interest, a portion of the transmission received beginning at a time temporally removed from the sensed start of the transmission, such isolation being obtained by timing the expected interval between the sensed start of the transmission and the time temporally removed from the sensed beginning of the transmission;

tagging the information-of-interest isolated, at the time temporally removed from the sensed beginning of the transmission, for processing;

and beginning processing with information just preceding the information-of-interest.

13. In a communications system having a transmission containing an information-of-interest at a predetermined location within the transmission, a method for isolating and processing that information-of-interest, comprising:

sensing the start of the transmission from a received signal power of the transmission exceeding a predetermined threshold;

AGCing the transmission and attenuating the AGC'd transmission from a maximum level to a desired level before the information-of-interest is expected to arrive and holding the AGC voltage at a level prevailing at a predetermined instant with a diode detector in the receiver's I.F. stage;

isolating, for processing as the information-of-interest, the information received beginning at a time temporally removed from the sensed start of the transmission, such isolation being obtained by timing the expected interval between the sensed start of the transmission and the time temporally removed at which the information-of-interest should arrive;

digitizing the information by oversampling in an analog-to-digital converter (A/D), tagging the digitized information-of-interest, and storing the digitized samples for subsequent processing;

and beginning off-line, non-real-time processing with information just preceding the isolated information-of-interest.

14. In a communications system having a transmission containing an information-of-interest at a predetermined location within the transmission, an apparatus for isolation and processing that information-of-interest, comprising:

means for sensing a beginning of the transmission, operatively coupled with means for isolating for processing as the information-of-interest, the information received beginning at a time temporally removed from the sensed beginning of the transmission;

means for processing the information-of-interest isolated beginning at the time temporally removed from the sensed beginning of the transmission; and means for decoding, detecting, and/or correlating the information-of-interest, non-real-time, in a Digital Signal Processor.

15. In a communications system having a transmission containing an information-of-interest at a predetermined location within the transmission, an apparatus for isolating and processing that information-of-interest, comprising, operatively coupled in series:

means for sensing the start of the transmission from a received signal power of the transmission exceeding a predetermined threshold;

means for AGCing the transmission and attenuating the AGC'd transmission from a maximum level to a desired level before the information-of-interest is expected to arrive;

means for isolating for processing as the information-of-interest, the information beginning approximately at a time temporally removed from the sensed start of the transmission, by timing an expected interval between the sensed start of the transmission and the time temporally removed in which the information-of-interest is expected to begin;

means for tagging the information-of-interest, isolated beginning approximately at the time temporally removed, for processing;

and means for beginning processing with information just preceding the isolated information-of-interest.

16. In a communications system having transmissions a transmission containing an information-of-interest at a predetermined location within the transmission, an apparatus for isolating and processing that information-of-interest, comprising, operatively coupled in series:

means for sensing the start of the transmission from a received signal power of the transmission exceeding a predetermined threshold;

means for AGCing the transmission and attenuating the AGC'd transmission from a maximum level to a desired level before the information-of-interest is expected to arrive and holding the AGC voltage at a level prevailing at a predetermined instant with a diode detector in the receiver's I.F. stage;

means for isolating for processing as the information-of-interest, the information received beginning approximately at a time temporally removed from the sensed start of the transmission, by timing the expected interval between the sensed start of the transmission and the time temporally removed in which the information-of-interest is expected to begin;

means for digitizing the information by oversampling in an analog-to-digital converter (A/D) and storing the digitized samples for subsequent processing, tagging the digitized information-of-interest, isolated beginning approximately at that time temporally removed, for processing, and storing the digitized samples for subsequent processing;

and means for beginning off-line, non-real-time processing with information just preceding the isolated information-of-interest.

* * * * *